US012607886B2

(12) United States Patent
Fukushima et al.

(10) Patent No.: US 12,607,886 B2
(45) Date of Patent: Apr. 21, 2026

(54) SEMICONDUCTOR LIGHT MODULATING APPARATUS

(71) Applicant: Mitsubishi Electric Corporation, Tokyo (JP)

(72) Inventors: Hayata Fukushima, Tokyo (JP); Yojiro Watanabe, Tokyo (JP); Seiji Nakano, Tokyo (JP); Yu Uwadoi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 514 days.

(21) Appl. No.: 18/004,657

(22) PCT Filed: Dec. 9, 2020

(86) PCT No.: PCT/JP2020/045888
§ 371 (c)(1),
(2) Date: Jan. 6, 2023

(87) PCT Pub. No.: WO2022/123693
PCT Pub. Date: Jun. 16, 2022

(65) Prior Publication Data
US 2023/0251509 A1 Aug. 10, 2023

(51) Int. Cl.
*G02F 1/015* (2006.01)
*H01S 5/026* (2006.01)

(52) U.S. Cl.
CPC ............ *G02F 1/015* (2013.01); *H01S 5/0265* (2013.01); *G02F 2201/12* (2013.01)

(58) Field of Classification Search
None
See application file for complete search history.

(56) References Cited

U.S. PATENT DOCUMENTS 5,602,672 A * 2/1997 Ishimura ............... G02F 1/0121
359/245
2004/0212451 A1 * 10/2004 Iwamoto .............. H03H 9/0576
333/133
(Continued)

FOREIGN PATENT DOCUMENTS

JP        2001154161 A   *   6/2001
JP        2011-197360 A       10/2011
(Continued)

OTHER PUBLICATIONS

Zhu et al., "Electrical and Optical Coupling in an Electroabsorption Modulator Integrated With a DFB Laser", IEEE Journal of Quantum Electronics, Jun. 11, 2007, vol. 43, No. 7, p. 535-p. 544.
(Continued)

*Primary Examiner* — Sharrief I Broome
*Assistant Examiner* — Journey F Sumlar
(74) *Attorney, Agent, or Firm* — Studebaker Brackett PLLC

(57) ABSTRACT
A semiconductor light modulator (5) modulates light in accordance with a high-frequency wave signal (11). A terminal matching circuit (12) is connected in parallel to the semiconductor light modulator (5). The terminal matching circuit (12) has a resistor (8) and a capacitor (9) of 0.1 pF or lower connected in parallel to the resistor (8).

6 Claims, 13 Drawing Sheets

(56)                    References Cited

U.S. PATENT DOCUMENTS

| | | | |
|---|---|---|---|
| 2012/0045161 A1 | 2/2012 | Okada | |
| 2015/0261016 A1* | 9/2015 | Okada | G02F 1/0121 |
| | | | 359/245 |
| 2018/0067341 A1 | 3/2018 | Kanazawa et al. | |
| 2021/0044078 A1* | 2/2021 | Adachi | H01S 5/0239 |
| 2021/0218473 A1* | 7/2021 | Otani | H01S 5/02345 |
| 2022/0082874 A1* | 3/2022 | Kaikkonen | H01S 5/0265 |

FOREIGN PATENT DOCUMENTS

| | | | |
|---|---|---|---|
| JP | 2013-197479 A | 9/2013 | |
| JP | 2015-125153 A | 7/2015 | |
| WO | 2010140473 A1 | 12/2010 | |
| WO | 2016/152152 A1 | 9/2016 | |
| WO | 2019/229825 A1 | 12/2019 | |

OTHER PUBLICATIONS

International Search Report issued in PCT/JP2020/045888; mailed Jan. 19, 2021.

An Office Action; "Notice of Reasons for Refusal," mailed by the Japanese Patent Office on Jun. 8, 2021, which corresponds to Japanese Patent Application No. 2021-521072 with Partial English language translation.

\* cited by examiner

SEMICONDUCTOR LIGHT MODULATING APPARATUS

FIELD

The present disclosure relates to a semiconductor light modulating apparatus in which a terminal matching circuit is connected in parallel to a semiconductor light modulator.

BACKGROUND

A directly modulated laser (DML) suitable for low-speed modulation has often been used in an access system that is an optical communication system between a relay station and a user. When high-speed communication at 10 Gb/s or higher is performed, an electro-absorption modulator integrated laser diode (EAM-LD) that is a semiconductor integrated device in which an electro-absorption modulator (EAM) suitable for high-speed modulation and a distributed-feedback laser are integrated is suitable.

A laser beam passing through the EAM is modulated by applying a signal that repeatedly switches on and off at a frequency at which light is to be modulated to the EAM. In high-speed communication, a high-frequency wave signal that is offset with DC voltage is applied. The high-frequency wave signal is a high-frequency wave at 10 GHz or higher, and thus a line such as a coaxial line based on consideration of high-frequency wave characteristics is used as a power supply line.

In a case of the EAM-LD, as the frequency of an input signal increases, impedance matching becomes impossible and band degradation occurs due to influence of the parasitic capacity and parasitic resistance of a semiconductor light modulator, the inductance of a bonding wire, and the like. Thus, impedance matching is performed by a terminal matching circuit connected in parallel to the semiconductor light modulator, thereby improving frequency characteristics (refer to PTL 1, for example).

CITATION LIST

Patent Literature

[PTL 1] WO 2019/229825

SUMMARY

Technical Problem

However, with the conventional technology, it has been impossible to obtain favorable frequency characteristics while ensuring a desired band.

The present disclosure is intended to solve the above-described problem and obtain a semiconductor light modulating apparatus that can obtain favorable frequency characteristics while ensuring a desired band.

Solution to Problem

A semiconductor light modulating apparatus according to the present disclosure includes: a semiconductor light modulator modulating light in accordance with a high-frequency wave signal; and a terminal matching circuit connected in parallel to the semiconductor light modulator, wherein the terminal matching circuit has a resistor and a capacitor of 0.1 pF or lower connected in parallel to the resistor.

Advantageous Effects of Invention

In the present disclosure, the terminal matching circuit connected in parallel to the semiconductor light modulator has a configuration in which the resistor and the capacitor of 0.1 pF or lower are connected in parallel to each other. With this configuration, gain variation can be reduced at a low frequency until a cutoff frequency is reached, and gain decrease and band degradation can be reduced at a higher frequency. As a result, it is possible to obtain favorable frequency characteristics while ensuring a desired band.

DESCRIPTION OF EMBODIMENTS

A semiconductor light modulating apparatus according to the embodiments of the present disclosure will be described with reference to the drawings. The same components will be denoted by the same symbols, and the repeated description thereof may be omitted.

Embodiment 1

Figure 1:
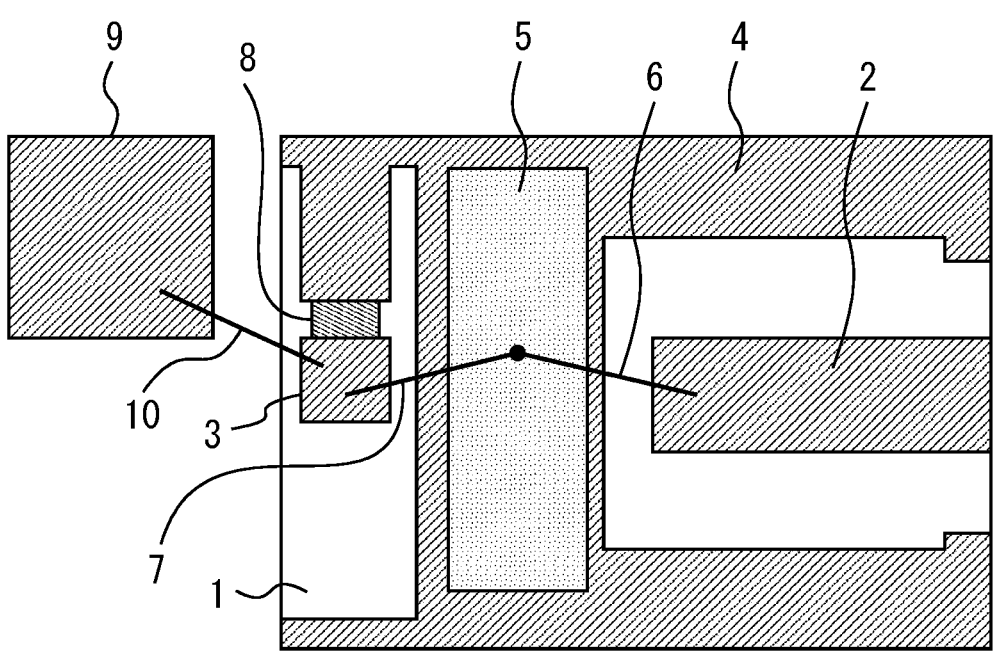
FIG. 1 is a plan view illustrating a semiconductor light modulating apparatus according to Embodiment 1.

FIG. 1 is a plan view illustrating a semiconductor light modulating apparatus according to Embodiment 1. Signal conductors 2 and 3 are formed on the front surface of a dielectric substrate 1, and a ground conductor 4 that is electrically connected is formed on part of the front surface of the dielectric substrate 1, the side surface and the back surface thereof. A semiconductor light modulator 5 is mounted on the ground conductor 4 on the front surface of the dielectric substrate 1. A lower-surface electrode of the semiconductor light modulator 5 is connected to the ground conductor 4.

An upper-surface electrode of the semiconductor light modulator 5 is connected to the signal conductor 2 through a bonding wire 6 and connected to the signal conductor 3 through a bonding wire 7. A resistor 8 is connected between the signal conductor 3 and the ground conductor 4. A minute capacitor 9 of 0.1 pF or lower is connected to the signal conductor 3 through a bonding wire 10.

Figure 2:
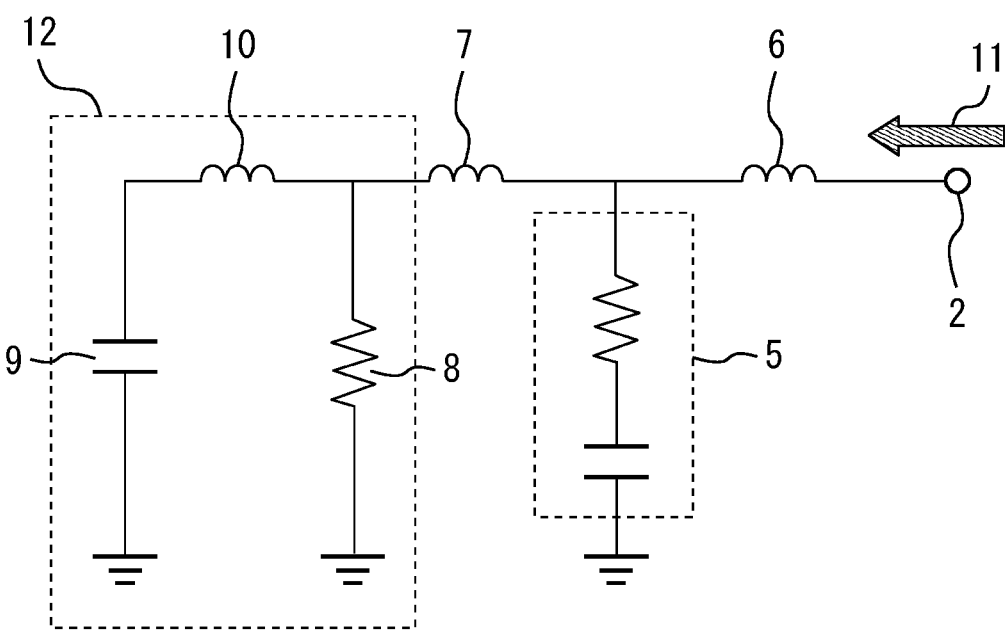
FIG. 2 is a circuit diagram illustrating the semiconductor light modulating apparatus according to Embodiment 1.

FIG. 2 is a circuit diagram illustrating the semiconductor light modulating apparatus according to Embodiment 1. A high-frequency wave signal 11 is supplied from the signal conductor 2 to the semiconductor light modulator 5 through the bonding wire 6. The semiconductor light modulator 5 modulates light in accordance with the high-frequency wave signal 11. A terminal matching circuit 12 is connected in parallel to the semiconductor light modulator 5. The terminal matching circuit 12 includes the resistor 8, the capacitor 9 of 0.1 pF or lower, which is connected in parallel to the resistor 8, and the bonding wire 10 connecting the resistor 8 and the capacitor 9.

Figure 3:
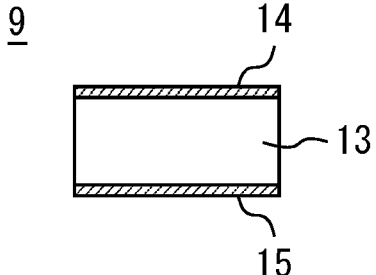
FIG. 3 is a cross-sectional view illustrating the capacitor of the semiconductor light modulating apparatus according to Embodiment 1.

FIG. 3 is a cross-sectional view illustrating the capacitor of the semiconductor light modulating apparatus according to Embodiment 1. The capacitor 9 includes a dielectric material 13, and a signal conductor 14 and a ground conductor 15 sandwiching the dielectric material 13 therebetween. The dielectric material 13 is a component separated from the dielectric substrate 1.

Figure 4:
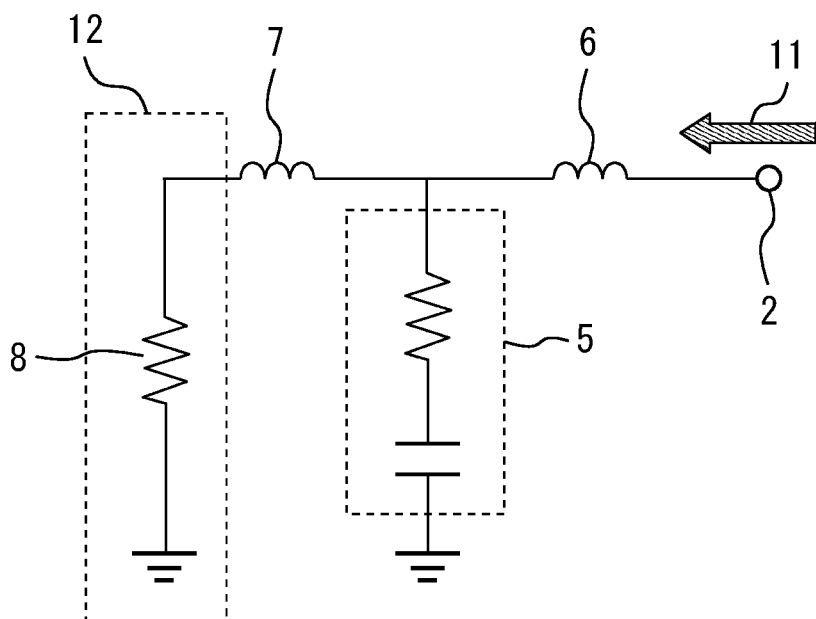
FIG. 4 is a circuit diagram illustrating a semiconductor light modulating apparatus according to the comparative example.

Next, effects of the present embodiment will be described in comparison with a comparative example. FIG. 4 is a circuit diagram illustrating a semiconductor light modulating apparatus according to the comparative example. In the comparative example, the capacitor 9 and the bonding wire 10 are omitted in the terminal matching circuit 12, and only the resistor 8 is included in the terminal matching circuit 12.

FIGS. 5 to 11 are diagrams illustrating simulation results of frequency characteristics of the semiconductor light modulating apparatus according to Embodiments 1 and 2. Frequency characteristics of S21 (transmission component) among S parameters are illustrated. The resistance value of the resistor 8 is 40Ω. In the drawing, "no capacitor" corresponds to a case of the comparative example, and "no wire" corresponds to a case of Embodiment 2 to be described later.

Figure 5:
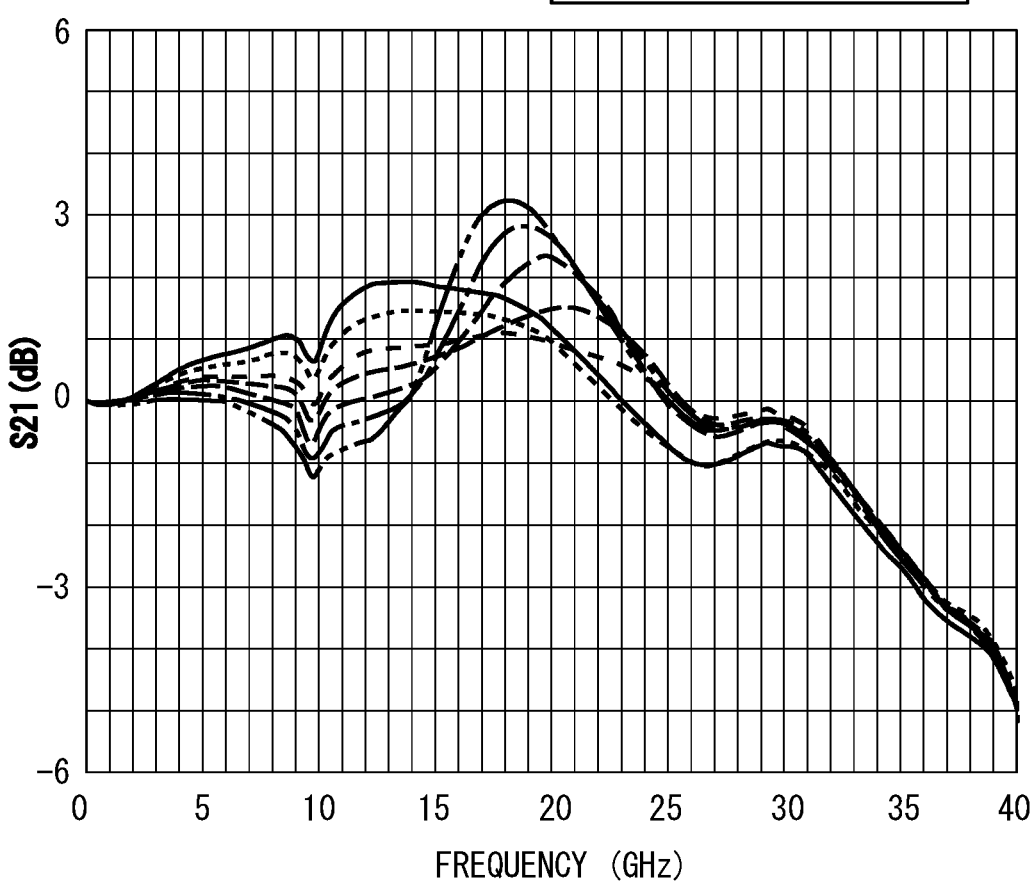
FIG. 5 is a diagram illustrating simulation results of frequency characteristics of the semiconductor light modulating apparatus according to Embodiments 1 and 2.

In FIG. 5, the capacitance value of the capacitor 9 is 0.014 to 0.14 pF, and the inductance of the bonding wire 10 is 0.392 nH. It can be understood that, since the terminal matching circuit 12 includes the minute capacitor 9, the present embodiment achieves frequency characteristic improvement such as gain improvement by 20 to 30 GHz approximately and gain variation reduction by 0 to 30 GHz as compared to the case of the comparative example without a capacitor.

In FIGS. 6 to 11, simulation is performed with the capacitance value of the capacitor 9 set to 0.014 to 0.14 pF and the inductance of the bonding wire 10 set to 0.166 to 1.078 nH. Note that the minimum inductance 0.166 nH corresponds to the wire length of 0.3 mm. The shorter wire length cannot be implemented with a simulation model as realization of Embodiment 1, and the implementation is difficult in actual production as well.

Figure 6:
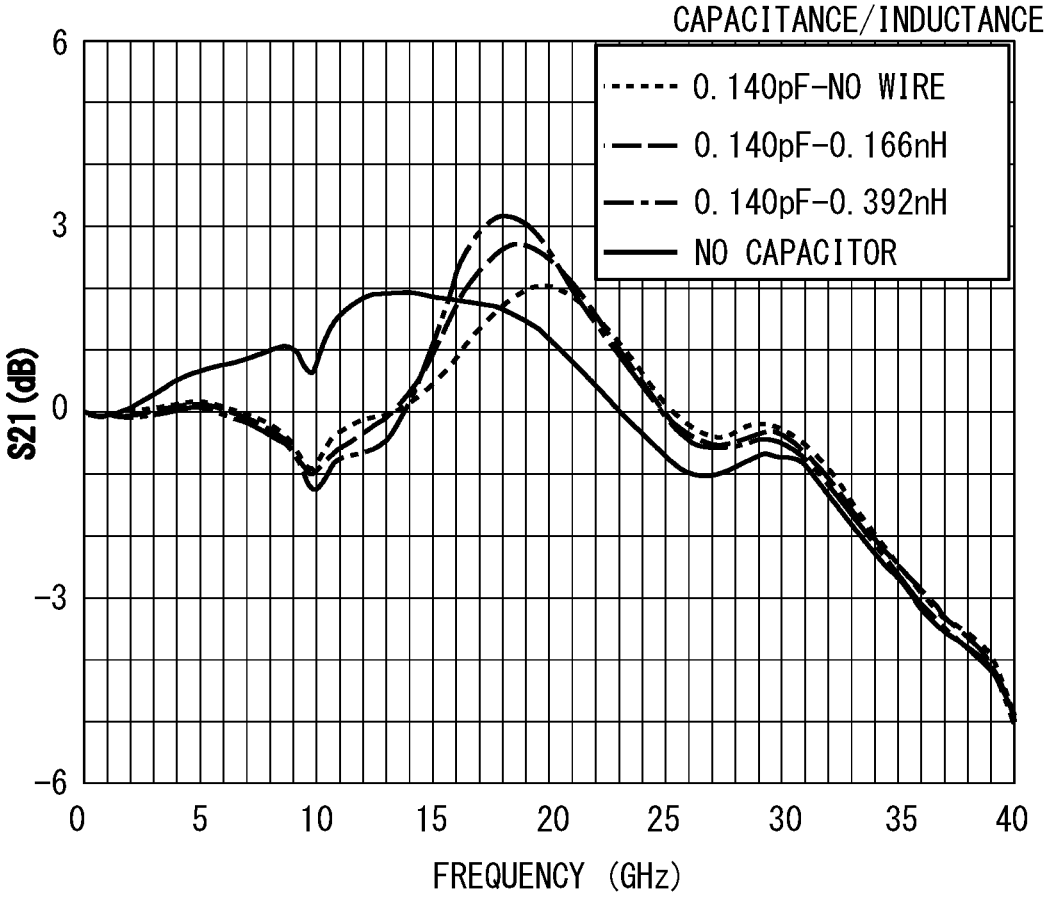
FIG. 6 is a diagram illustrating simulation results of frequency characteristics of the semiconductor light modulating apparatus according to Embodiments 1 and 2.
Figure 7:
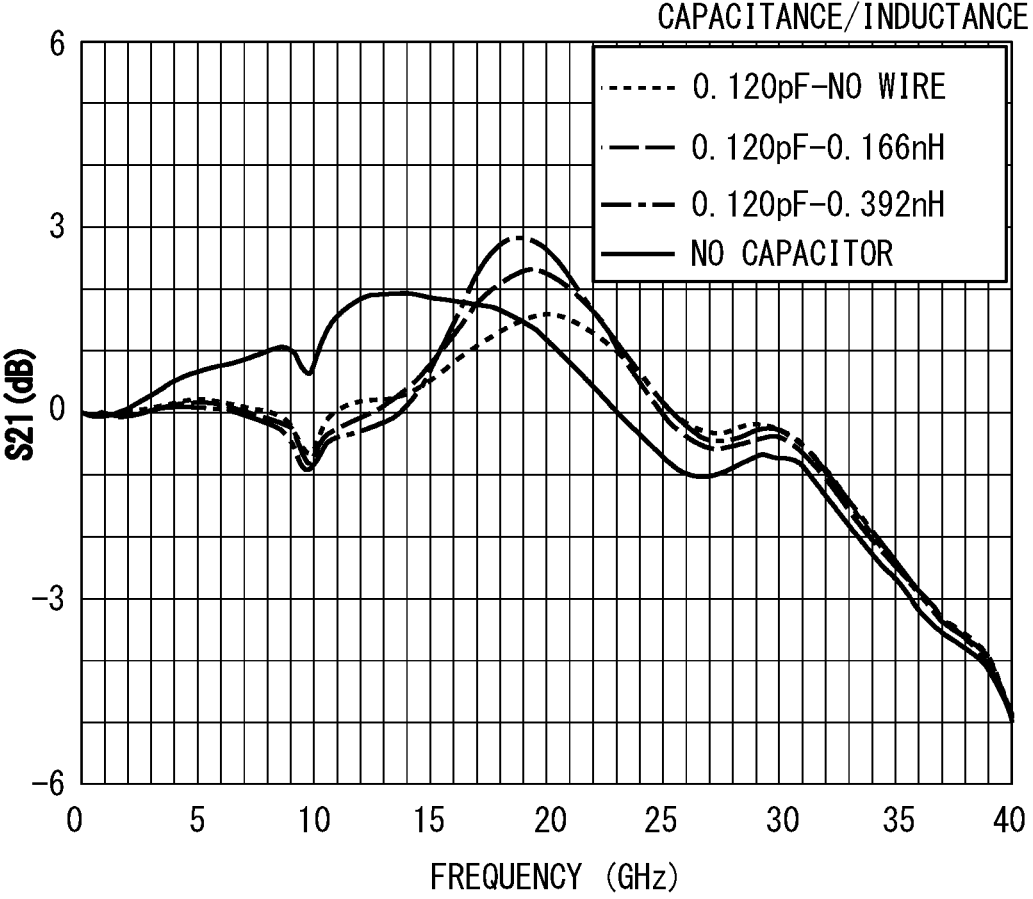
FIG. 7 is a diagram illustrating simulation results of frequency characteristics of the semiconductor light modulating apparatus according to Embodiments 1 and 2.

The capacitance value of the capacitor 9 is 0.14 pF in FIG. 6 and 0.12 pF in FIG. 7 and the inductance of the bonding wire 10 is changed. In these cases, under any inductance condition, gain variation is larger than in the comparative example without a capacitor, and almost no improvement effect is obtained.

Figure 8:
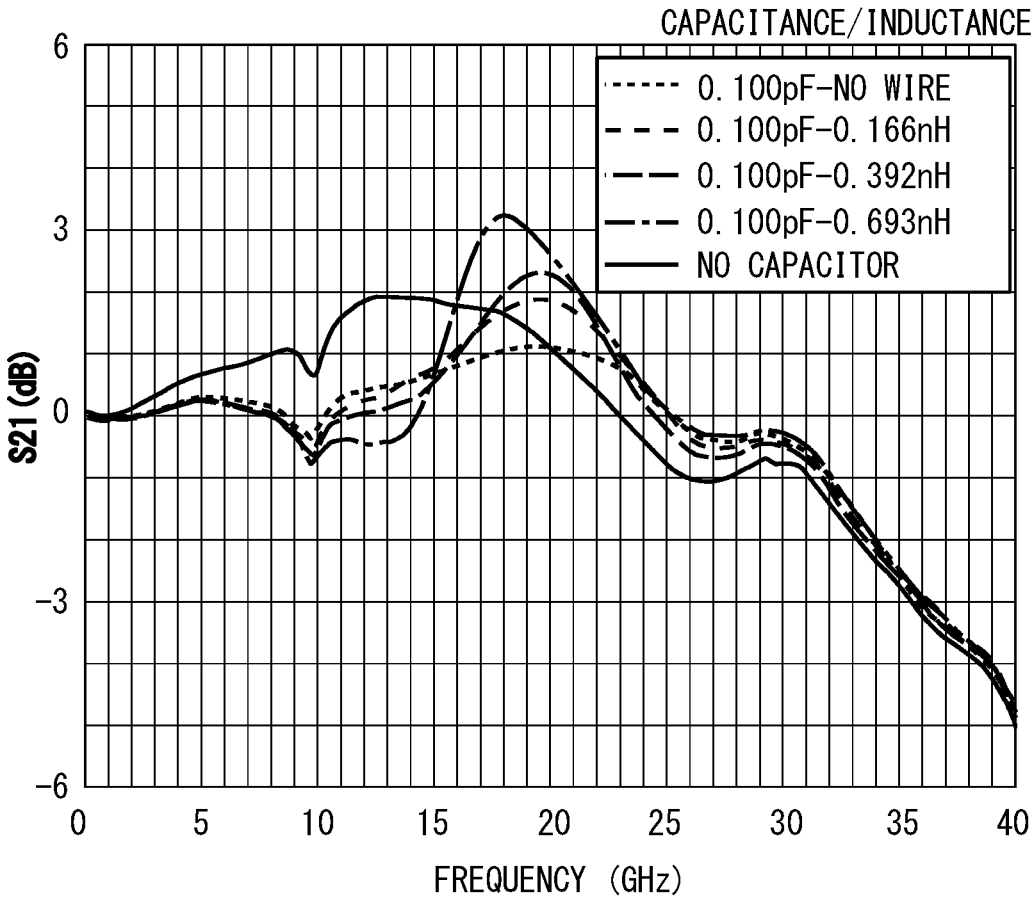
FIG. 8 is a diagram illustrating simulation results of frequency characteristics of the semiconductor light modulating apparatus according to Embodiments 1 and 2.
Figure 9:
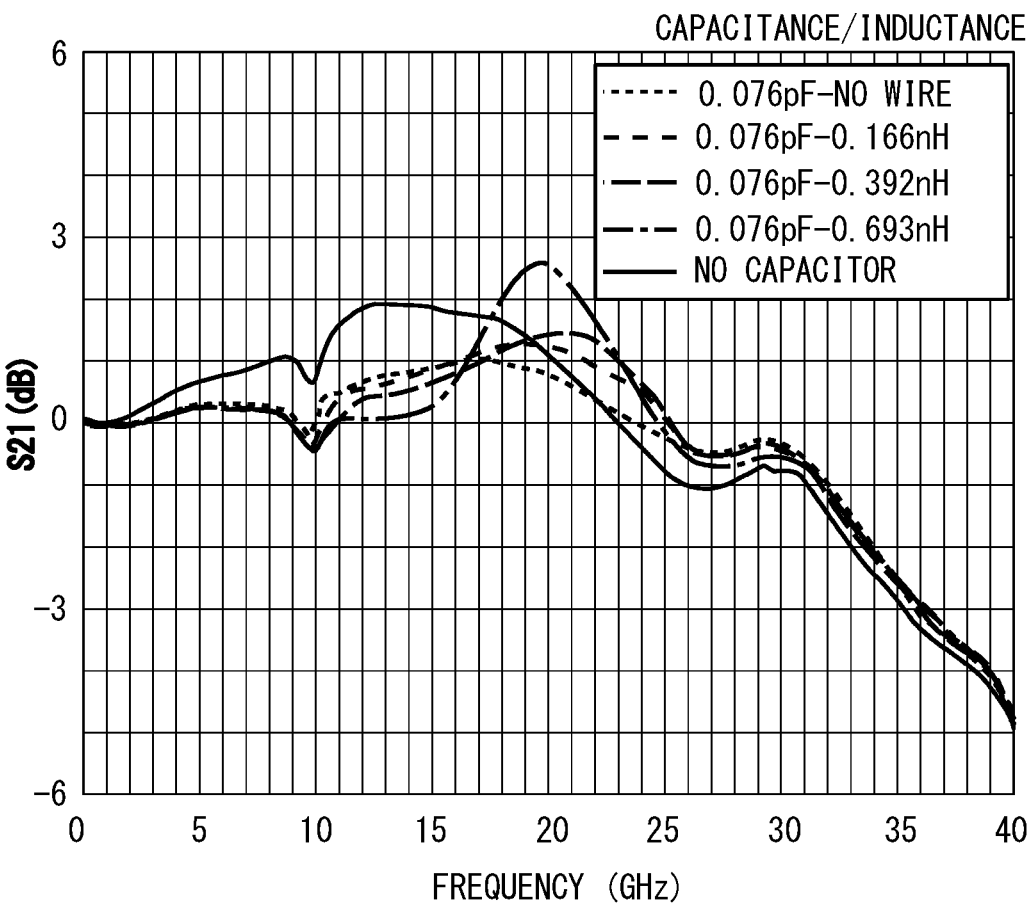
FIG. 9 is a diagram illustrating simulation results of frequency characteristics of the semiconductor light modulating apparatus according to Embodiments 1 and 2.

In FIG. 8, the capacitance value of the capacitor 9 is 0.1 pF and the inductance of the bonding wire 10 is changed. In this case, it can be understood that, under a condition that the wire is short and the inductance is small at 0.166 nH, gain variation is reduced as compared to the comparative example without a capacitor and the improvement effect is obtained. Thus, it is thought that the capacitor 9 needs to be set to 0.1 pF or lower.

Figure 10:
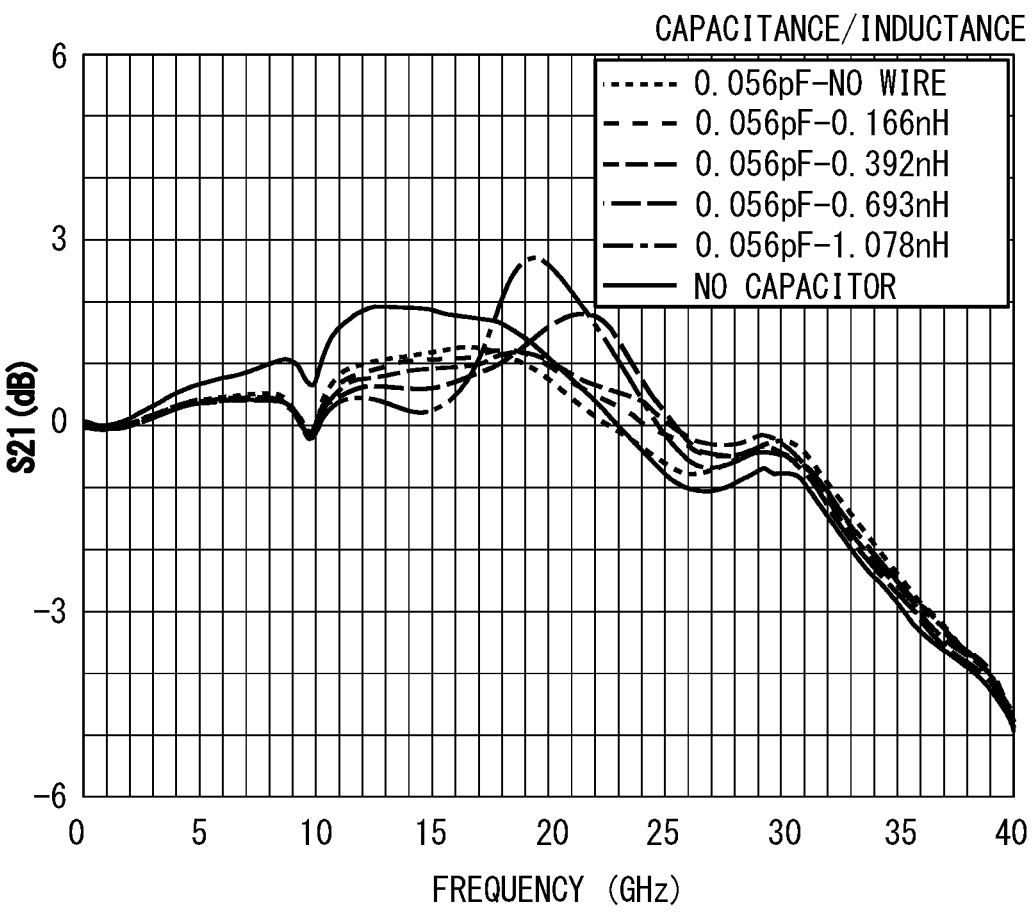
FIG. 10 is a diagram illustrating simulation results of frequency characteristics of the semiconductor light modulating apparatus according to Embodiments 1 and 2.
Figure 11:
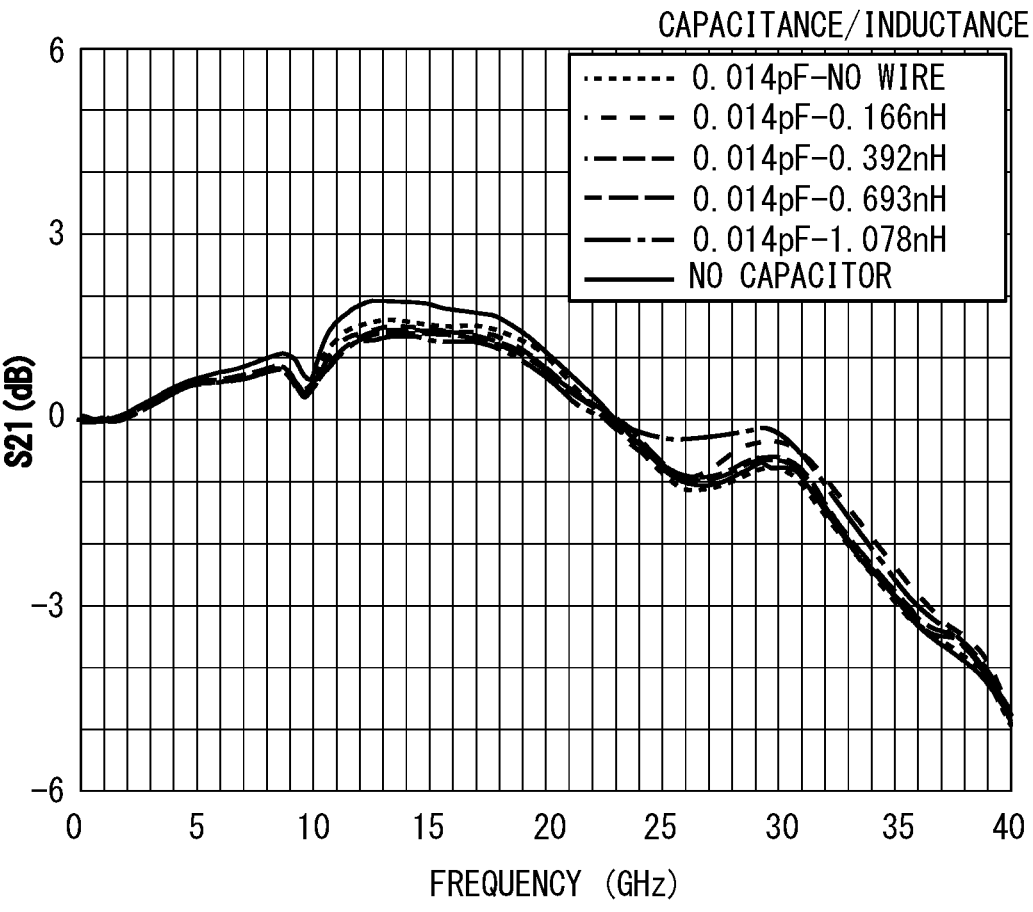
FIG. 11 is a diagram illustrating simulation results of frequency characteristics of the semiconductor light modulating apparatus according to Embodiments 1 and 2.

It can be understood that, when the capacitance value of the capacitor 9 is set to 0.1 pF or higher, influence of inductance change on gain variation of 0 to 30 GHz is large and the inductance is preferably as low as possible. Thus, as typically known, the bonding wire 10 needs to be as short as possible. However, it can be understood that, as the capacitance value of the capacitor 9 is set to a lower value, influence of change of the inductance of the bonding wire 10 on gain variation of 0 to 30 GHz decreases while the improvement effect of frequency characteristics is maintained. The inductance of 0.166 to 1.078 nH corresponds to the bonding wire length of 0.3 to 1.2 mm. Thus, with the capacitor 9 having a capacitance value of 0.1 pF or lower, it is possible to increase the length of the bonding wire 10 connected to the capacitor 9 while maintaining the improvement effect of frequency characteristics. Note that flat frequency characteristics with smallest gain variation are obtained when the capacitor 9 and the inductance of the bonding wire 10 are set to 0.056 pF and 0.392 nH, respectively, in combination as illustrated in FIG. 10.

As described above, in the present embodiment, the terminal matching circuit 12 connected in parallel to the semiconductor light modulator 5 has a configuration in which the resistor 8 and the capacitor 9 of 0.1 pF or lower are connected in parallel to each other. With this configuration, gain variation can be reduced at a low frequency until a cutoff frequency is reached, and gain decrease and band degradation can be reduced at a higher frequency. As a result, it is possible to obtain favorable frequency characteristics while ensuring a desired band.

Moreover, when the capacitance value of the capacitor 9 is set to 0.1 pF or lower, the improvement effect of frequency characteristics is obtained without shortening the bonding wire 10 connected to the capacitor 9. Thus, it is possible to increase the freedom of structure designing of the semiconductor light modulating apparatus.

Note that the capacitance value of a capacitor having a structure that allows application as the capacitor 9 and sold as a product is 0.1 pF at minimum. However, a capacitance value tolerance (capacitance allowable tolerance) guaranteed in a catalog is 0.1 pF. Accordingly, the lower limit of the capacitance value of a commercially available capacitor is 0.1±0.1 pF to be exact. Thus, the capacitance value of 0.1 pF or lower is not reliably obtained with the commercially available capacitor.

The specific dielectric constant of the dielectric material of such a commercially available 0.1 pF capacitor is calculated to be 63.3. Thus, the specific dielectric constant of the dielectric material 13 of the capacitor 9 is set to 63.3 or lower. Accordingly, the dimension allowable tolerance of the dielectric material 13 can be relaxed with the same capacitance allowable tolerance. In addition, a capacitor of 0.1 pF or lower can be achieved in dimensions that allow mounting as the capacitor 9 on the semiconductor light modulating apparatus.

An aluminum nitride ceramic substrate having a specific dielectric constant of 8.8 can be applied as the dielectric material 13. Alternatively, an alumina ceramic substrate having a specific dielectric constant of 8.5 to 10 may be applied as the dielectric material 13. The capacitor 9 can be produced at low cost by using such a ceramic substrate having a simple structure. Moreover, since the dielectric constant is low, a capacitor of 0.1 pF or lower can be accurately mounted.

Embodiment 2

Figure 12:
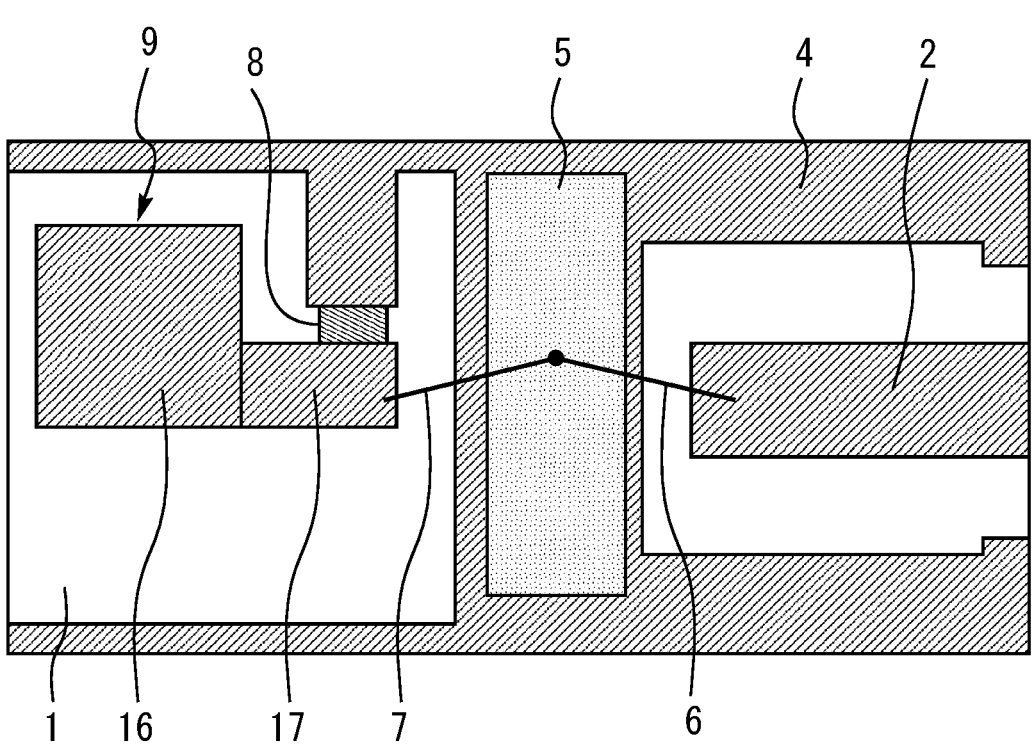
FIG. 12 is a plan view illustrating a semiconductor light modulating apparatus according to Embodiment 2.
Figure 13:
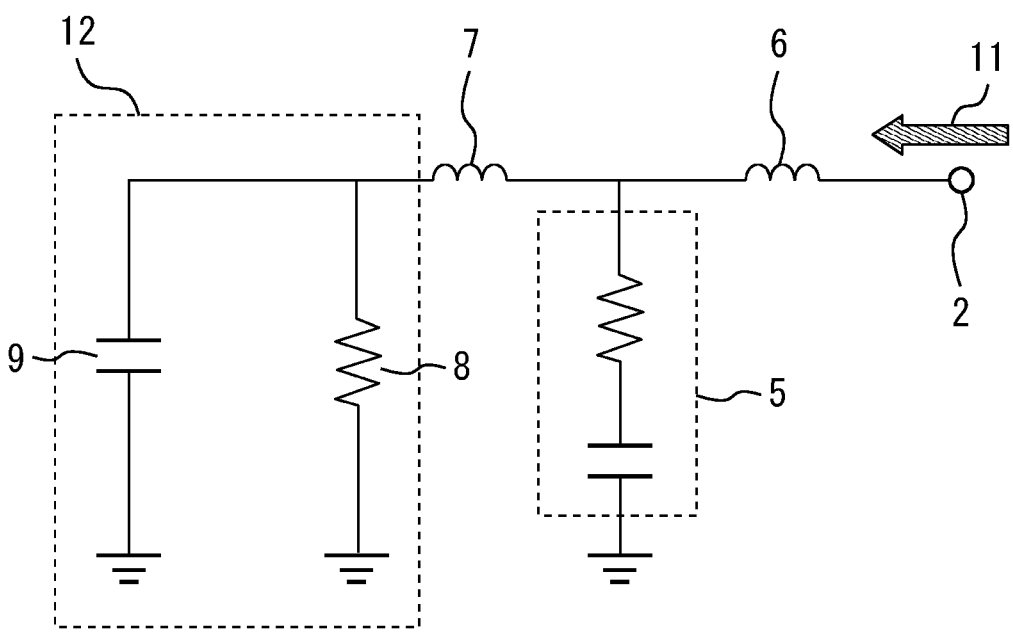
FIG. 13 is a circuit diagram illustrating the semiconductor light modulating apparatus according to Embodiment 2.

FIG. 12 is a plan view illustrating a semiconductor light modulating apparatus according to Embodiment 2. FIG. 13 is a circuit diagram illustrating the semiconductor light modulating apparatus according to Embodiment 2. The dielectric substrate 1 according to the present embodiment is an integration of the dielectric substrate 1 according to Embodiment 1 and the dielectric material 13.

The capacitor 9 is formed by sandwiching the dielectric substrate 1, on which the semiconductor light modulator 5 is mounted, between a signal conductor 16 formed on the front surface of the dielectric substrate 1 and the ground conductor 4 formed on the back surface of the dielectric substrate 1. The capacitor 9 is connected to the resistor 8 through a signal conductor 17.

The signal conductor 16 included in the capacitor 9 can be integrated with the signal conductor 17 connecting the capacitor 9 and the resistor 8. Thus, the bonding wire 10 according to Embodiment 1 can be omitted. Moreover, the capacitance value of the capacitor 9 can be adjusted by adjusting the dimensions of the signal conductor 16.

Figure 14:
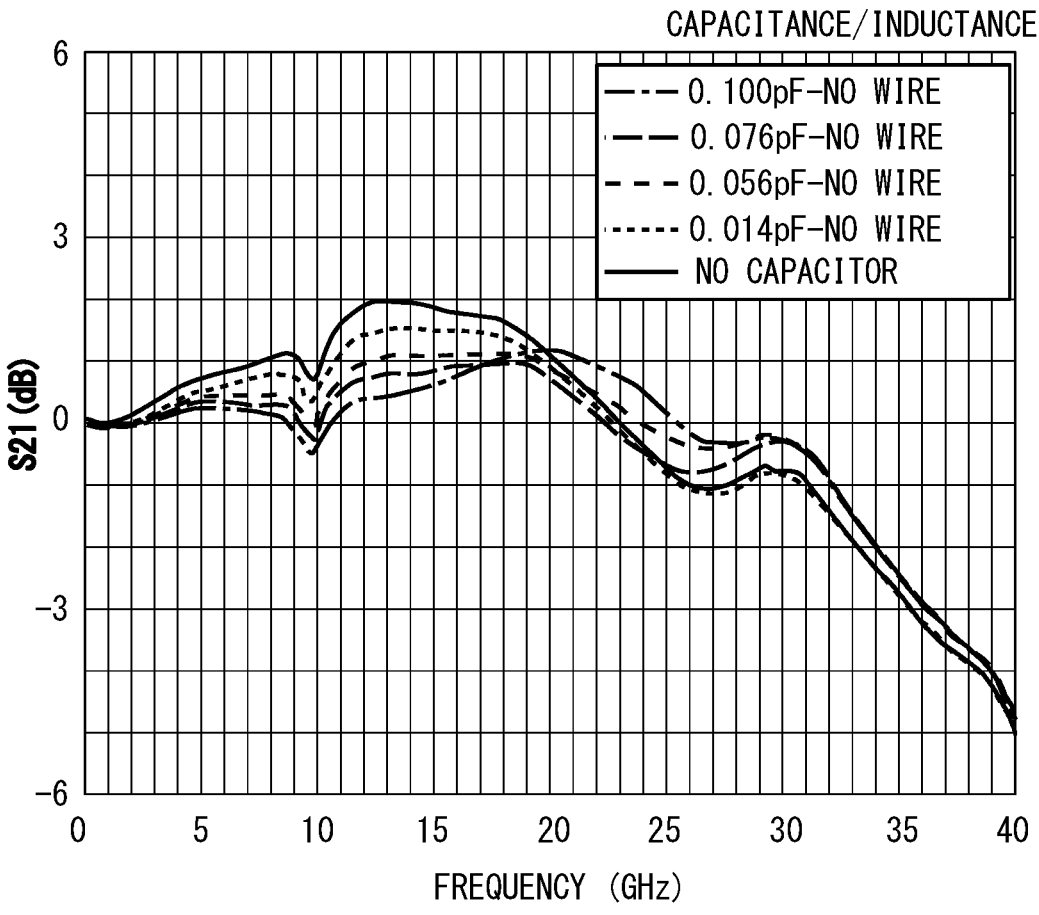
FIG. 14 is a diagram illustrating simulation results of frequency characteristics of the semiconductor light modulating apparatus according to Embodiment 2.

FIG. 14 is a diagram illustrating simulation results of frequency characteristics of the semiconductor light modulating apparatus according to Embodiment 2. In FIG. 14, the resistance value of the resistor 8 is 40Ω and the capacitance value of the capacitor 9 is 0.014 to 0.1 pF. It can be understood that cutoff frequency improvement and further gain variation reduction are obtained as compared to FIG. 5, which has influence of the inductance of the bonding wire 10, although difference is small for low capacitance such as 0.014 pF and 0.056 pF.

In FIGS. 6 to 11, "no wire" indicates a simulation result in Embodiment 2, corresponding to each capacitance value of the capacitor 9. It can be understood from these diagrams that an effect as an extension of reduction of the inductance of the bonding wire 10 according to Embodiment 1 is obtained when the bonding wire 10 is omitted in the present embodiment. Note that, in the present embodiment as well, when the capacitance value of the capacitor 9 is 0.14 pF, gain variation is larger than in the comparative example without a capacitor and no improvement effect is obtained. When the capacitance value of the capacitor 9 is 0.12 pF, a faint improvement effect as compared to the comparative example can be obtained.

In the present embodiment, the dielectric substrate 1 is made of a dielectric material having a specific dielectric constant equal to or smaller than 63.3. For example, an aluminum nitride ceramic substrate having a specific dielectric constant of 8.8 or an alumina ceramic substrate having a specific dielectric constant of 8.5 to 10 is applied as the dielectric material.

Various exemplary embodiments and examples have been described in the present application, but the various characteristics, aspects, and functions described in one or a plurality of embodiments are not limited to application of a particular embodiment but are applicable alone or in various combinations to an embodiment. Thus, numerous modifications not exemplarily described are assumed in the range of technologies disclosed in the specification of the present application. For example, such modifications include alteration, addition, or omission of at least one constituent component, and extraction of at least one constituent component and combination thereof with a constituent component of another embodiment.

REFERENCE SIGNS LIST

1 dielectric substrate; 4 ground conductor; 5 semiconductor light modulator; 8 resistor; 9 capacitor; 10 bonding wire; 11 high-frequency wave signal; 12 terminal matching circuit; 13 dielectric material; 14,16 signal conductor; 15 ground conductor

The invention claimed is:

1. A semiconductor light modulating apparatus comprising:

a semiconductor light modulator modulating light in accordance with a high-frequency wave signal; and a terminal matching circuit connected in parallel to the semiconductor light modulator, wherein the terminal matching circuit has a resistor, a capacitor connected in parallel to the resistor, and a bonding wire connecting the resistor and the capacitor, wherein a capacitance value of the capacitor is 0.1 pF or lower and inductance of the bonding wire is 0.166 nH or lower, or the capacitance value is 0.076 pF or lower and the inductance is 0.392 nH or lower, or the capacitance value is 0.056 pF or lower and the inductance is 0.693 nH or lower, or the capacitance value is 0.014 pF or lower and the inductance is 1.078 nH or lower.

2. The semiconductor light modulating apparatus according to claim 1, wherein the capacitor includes a dielectric material having a specific dielectric constant of 63.3 or lower, and conductors sandwiching the dielectric material therebetween.

3. The semiconductor light modulating apparatus according to claim 2, wherein the dielectric material is an aluminum nitride ceramic substrate.

4. The semiconductor light modulating apparatus according to claim 2, wherein the dielectric material is an alumina ceramic substrate having a specific dielectric constant of 8.5 to 10.

5. The semiconductor light modulating apparatus according to claim 1, wherein the terminal matching circuit is different from the semiconductor light modulator.

6. The semiconductor light modulating apparatus according to claim 1, wherein wherein the bonding wire is connected between the resistor and the capacitor such that the capacitor is connected to the resistor by way of the bonding wire and the capacitor is connected to the semiconductor light modulator by way of the bonding wire.

* * * * *